United States Patent
Hatch et al.

(10) Patent No.: US 9,795,035 B2
(45) Date of Patent: Oct. 17, 2017

(54) RAPID PCB PROTOTYPING BY SELECTIVE ADHESION

(71) Applicant: HONEYWELL FEDERAL MANUFACTURING & TECHNOLOGIES, LLC, Kansas City, MO (US)

(72) Inventors: Jonathan Douglas Hatch, Cleveland, OH (US); Stephen McGarry Hatch, Blue Springs, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 0 days.

(21) Appl. No.: 15/356,852

(22) Filed: Nov. 21, 2016

(65) Prior Publication Data

US 2017/0164463 A1    Jun. 8, 2017

Related U.S. Application Data

(63) Continuation of application No. 14/957,426, filed on Dec. 2, 2015, now Pat. No. 9,504,148.

(51) Int. Cl.
*H05K 1/14* (2006.01)
*H05K 3/46* (2006.01)
(Continued)

(52) U.S. Cl.
CPC ............. *H05K 1/144* (2013.01); *H05K 1/028* (2013.01); *H05K 1/115* (2013.01); *H05K 3/103* (2013.01);
(Continued)

(58) Field of Classification Search
CPC ........ H05K 1/14; H05K 1/144; H05K 3/4635; H05K 3/4611
See application file for complete search history.

(56) References Cited

U.S. PATENT DOCUMENTS

| | | |
|---|---|---|
| 3,606,677 A | 9/1971 | Ryan |
| 4,254,186 A | 3/1981 | Acitelli |

(Continued)

FOREIGN PATENT DOCUMENTS

| | | |
|---|---|---|
| EP | 0185998 A1 | 7/1986 |
| JP | 2001345338 A | 12/2001 |

OTHER PUBLICATIONS

International Search Report and Written Opinion for Intl. Pat. No. PCT/US2016/064398; Filed Dec. 1, 2016.
(Continued)

*Primary Examiner* — Jeremy C Norris
(74) *Attorney, Agent, or Firm* — Hovey Williams LLP

(57) ABSTRACT

A PCB page blank includes a flexible substrate, a curable adhesive, a conductive layer, and a conductive layer support. The flexible substrate receives an opaque negative circuit pattern thereon. Portions of the curable adhesive not obscured by the circuit pattern may bond to portions of the conductive layer when exposed to light. The bonded portions of the conductive layer shear or tear from non-bonded portions of the conductive layer such that the bonded portions remain with the flexible substrate and the non-bonded portions remain with the conductive layer support when the flexible substrate and the conductive layer support are separated. The flexible substrate and the bonded portions of the conductive layer thus form a PCB prototype with the bonded portions of the conductive layer forming circuit traces of the circuit pattern.

20 Claims, 2 Drawing Sheets

(51) Int. Cl.
    *H05K 1/02*         (2006.01)
    *H05K 3/10*         (2006.01)
    *H05K 3/38*         (2006.01)
    *H05K 3/12*         (2006.01)
    *H05K 1/11*         (2006.01)

(52) U.S. Cl.
    CPC ............ *H05K 3/125* (2013.01); *H05K 3/386* (2013.01); *H05K 3/4611* (2013.01); *H05K 3/4644* (2013.01); *H05K 2201/05* (2013.01); *H05K 2201/09009* (2013.01)

(56) References Cited

U.S. PATENT DOCUMENTS

| | | |
|---|---|---|
| 4,465,538 A | 8/1984 | Schmoock |
| 5,017,255 A | 5/1991 | Calhoun et al. |
| 7,304,780 B2 | 12/2007 | Liu |
| 2007/0062723 A1 | 3/2007 | Kim |
| 2007/0102103 A1 | 5/2007 | Ku |
| 2009/0120676 A1 | 5/2009 | Rohn |
| 2009/0136874 A1 | 5/2009 | Kim |
| 2012/0222889 A1 | 9/2012 | Davis |
| 2013/0112233 A1 | 5/2013 | Coakley |

OTHER PUBLICATIONS

English translation of JP2001345338(A); dated Dec. 14, 2001.
Printem: Instant Printed Circuit Boards with Standard Office Printers & Inks; Published Nov. 9, 2015; Author: Varun Perumal C., University of Toronto, Toronto, ON, Canada, Daniel Wigdor, University of Toronto, Toronto, ON, Canada http://dl.acm.org/citation.cfm?id=2807511.

RAPID PCB PROTOTYPING BY SELECTIVE ADHESION

RELATED APPLICATION

This is a continuation of U.S. application Ser. No. 14/957,426, filed Dec. 2, 2015, entitled RAPID PCB PROTOTYPING BY SELECTIVE ADHESION, which is hereby incorporated by reference into the present application in its entirety.

BACKGROUND

Printed circuit boards (PCBs) are often used for prototyping circuit designs. However, constructing circuit patterns on PCBs is expensive and time consuming. For example, conventional methods used in the manufacturing of PCBs typically employ etchants, washes, and chemical deposition processes to selectively form layers of conductive material that produce the desired patterns. These chemical methods often require special processing or outsourcing to other manufacturers which can complicate and lengthen the PCB prototyping process. Other methods of manufacturing PCBs include milling operations or conductive ink printing, both of which require specialized equipment and have a high cost for materials. Also, most conductive ink processes lack the durability to solder electrical components to a physical circuit or electrical component.

SUMMARY

Embodiments of the present invention solve the above-mentioned problems and provide a distinct advancement in the art of PCB prototyping and manufacturing. More particularly, the present invention provides a prototyping method that is less expensive, less time consuming, and more readily available than conventional PCB prototyping processes.

Embodiments of the present invention provide a method of producing a fully functional and flexible PCB that can be used for testing, prototyping, and durable applications in a short amount of time. Resulting PCB prototypes may be utilized in engineering, manufacturing, education, and/or other environments where quick turnaround and low cost is important.

An embodiment of the present invention is a PCB page blank for prototyping a circuit design. The PCB page blank broadly includes a flexible substrate, a curable adhesive, a conductive layer, and a conductive layer support.

The flexible substrate may include a first side adjacent the curable adhesive and a second side for receiving an opaque negative circuit pattern thereon. The flexible substrate may be transparent or translucent for receiving light between gaps in the opaque negative circuit pattern.

The curable adhesive may be positioned between the first side of the flexible substrate and the conductive layer and may be a glue, caulk, or similar adhesive material. Portions of the curable adhesive may be selectively cured via light, as described below.

The conductive layer may be positioned between the curable adhesive and the conductive layer support and may be a thin, flexible or rigid conductive sheet or film. Portions of the conductive layer may bond to the curable adhesive, as described below.

The conductive layer support protects and supports the conductive layer and may be positioned adjacent the conductive layer opposite the curable adhesive. The conductive layer support may be lightly adhered to the conductive layer so that portions of the conductive layer that do not bond to the curable adhesive remain with the conductive layer support, as described below.

Use of the PCB page blank will now be summarized. First, an opaque negative circuit pattern may be printed or formed on the second side of the flexible substrate so as to obscure portions of the flexible substrate and portions of the curable adhesive. Gaps in the opaque negative circuit pattern will leave portions of the flexible substrate and corresponding portions of the curable adhesive unobscured.

The unobscured portions of the flexible substrate and curable adhesive may then be exposed to light such as UV or near-UV light. This exposure may cause the unobscured portions of the curable adhesive to cure and thereby bond to corresponding portions of the conductive layer. The obscured portions of the curable adhesive will remain uncured and thus will not bond to the conductive layer.

The flexible substrate and the conductive layer may then be separated such that the portions of the conductive layer that are bonded to the curable adhesive are retained by the curable adhesive and the portions of the conductive layer that are not bonded to the curable adhesive are retained by the conductive layer support. That is, the conductive layer may be sheared or torn between bonded and non-bonded portions. The flexible substrate, curable adhesive, and bonded portions of the conductive layer thus will form a prototyping circuit board with the bonded portions of the conductive layer thus forming one or more desired circuit traces of the circuit pattern. The PCB prototype may then be finished by soldering or connecting wires or other electronic components to the circuit traces.

The PCB page blank may be used with readily-available commercial or industrial-grade printers and computer systems such that the resulting circuit board may be formed without any additional tools. The circuit design may be produced on the PCB page blank without the need for major industrial equipment or harsh etching chemicals. The PCB page blank may be sized as needed to fit an available printer or to fit a desired application. The PCB page blank may also be one of a set of packaged PCB page blanks so that a number of prototyping iterations may be performed.

The above-described invention provides many advantages over conventional PCB prototyping and manufacturing methods. For example, the present invention circumvents outsourcing, complex processes, and the use of expensive materials. The present invention requires only a pre-formed sheet or "PCB page blank" and widely available consumer printing technology to create a fully functional PCB. The present invention only requires the ability to print an image (or negative image) of the desired circuit, selectively cure the adhesive, and then mechanically separate the layers of the PCB page blank. The resulting PCB is fully functional, solderable, and flexible. The present invention involves no chemical washes, etches, depositions, or machining processes and results in little to no material waste.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

BRIEF DESCRIPTION OF THE DRAWING FIGURES

Embodiments of the present invention are described in detail below with reference to the attached drawing figures, wherein.

Figure 1:
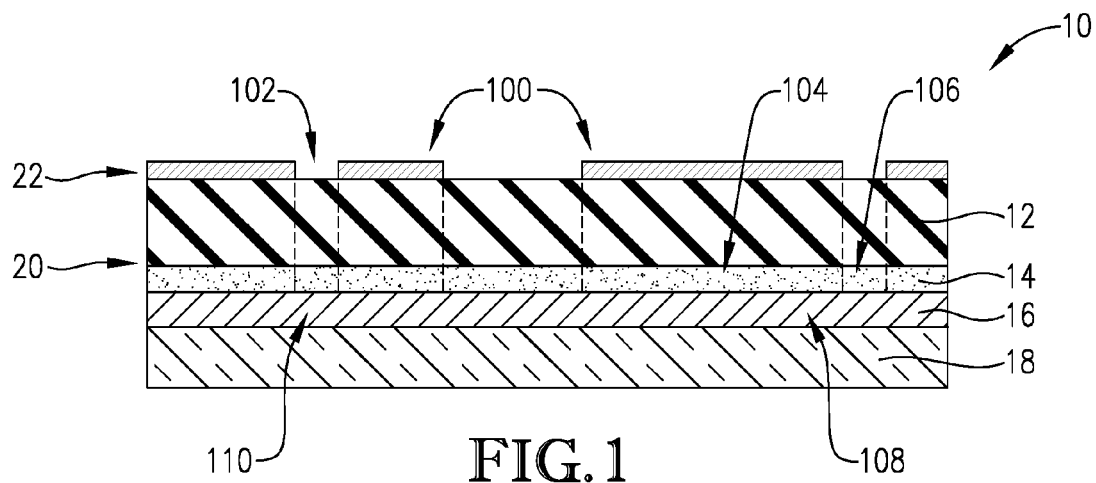
FIG. 1 is a vertical cross section view of a PCB page blank constructed in accordance with an embodiment of the present invention.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current technology can include a variety of combinations and/or integrations of the embodiments described herein.

Figure 2:
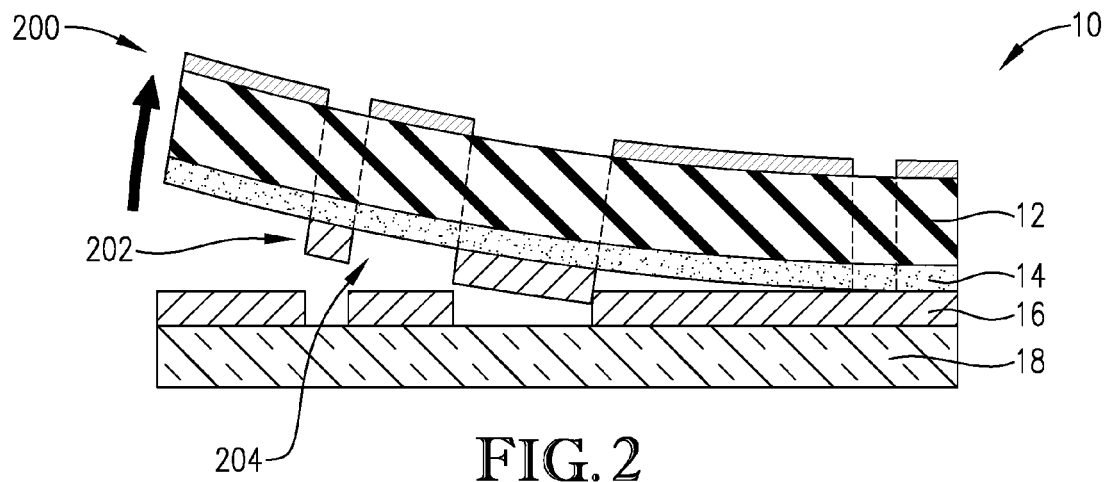
FIG. 2 is a vertical cross section view of the PCB page blank of FIG. 1 with the flexible substrate and conductive layer support being partially separated.
Figure 3:
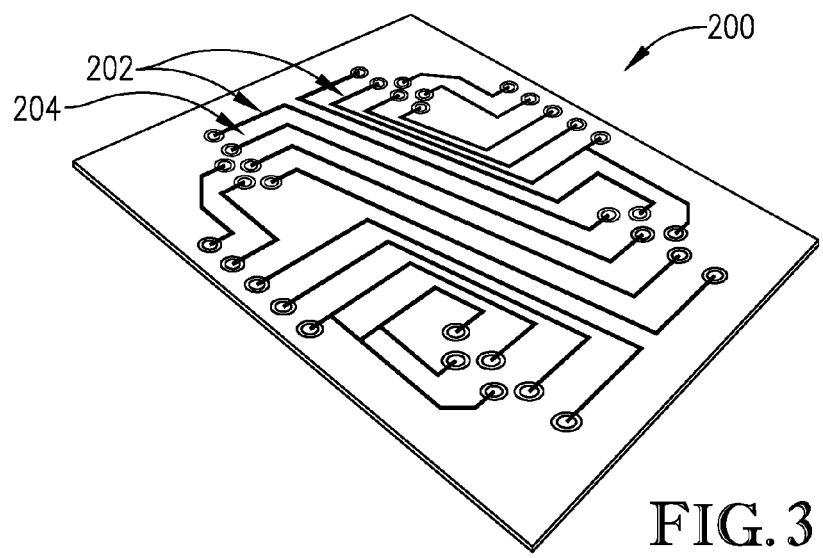
FIG. 3 is a perspective view of a PCB prototype constructed from the PCB page blank of FIG. 1.

Turning now to FIGS. 1-3, a PCB page blank 10 constructed in accordance with an embodiment of the invention is illustrated. The PCB page blank 10 broadly comprises a flexible substrate 12, a curable adhesive 14, a conductive layer 16, and a conductive layer support 18.

The flexible substrate 12 may include a first side 20 adjacent the curable adhesive 14 and a second side 22 opposite the first side 20 for receiving an opaque negative circuit pattern 100 thereon, as shown in FIG. 1. The flexible substrate 12 may be transparent or translucent for receiving light therethrough and may be an electrical insulator. The flexible substrate 12 may be formed of flexible plastic, polyester, or any other suitable flexible material. For example, the flexible substrate 12 may be formed of Mylar, Kapton, polyimide, polyether ether ketone, or a similar material. The flexible substrate 12 may be easily sheared, torn, or cut so that the page 10 may be formed from larger sheets of stock material.

The curable adhesive 14 may be positioned between the first side 20 of the flexible substrate 12 and the conductive layer 16 and may cure locally when exposed to near-UV light, UV light, blue wavelength light, light in any other range on the light wavelength spectrum such as infrared light or ultraviolet light, heat, or any other stimulant. That is, portions of the curable adhesive 14 exposed to the light may cure while adjacent portions of the curable adhesive 14 not exposed to the light may remain uncured. Thus, selective bonding to the conductive layer 16 may be achieved, as described in more detail below. The curable adhesive 14 may be Locktite® brand adhesive or any suitable curable adhesive and may be applied to the flexible substrate 12 as a spray, dipped, or rolled-on material.

The conductive layer 16 may be positioned between the curable adhesive 14 and the conductive layer support 18 and may be configured to bond to portions of the curable adhesive 14, as described in more detail below. The conductive layer 16 may be formed of a thin conductive foil, metal, or any other suitable material and may be applied as a foil or spray. The conductive layer 16 may easily shear or tear when the flexible substrate 12 and the conductive layer support 18 are separated, as described below.

The conductive layer support 18 protects and supports the conductive layer 16 before use and may be positioned adjacent the conductive layer 16 opposite the curable adhesive 14. The conductive layer support 18 may be lightly adhered to the conductive layer 16 via a low-tack adhesive such that the adherence between the conductive layer support 18 and the conductive layer 14 is less than the adherence from the bond between the conductive layer 16 and the cured portions of the curable adhesive 14, as described in more detail below. The conductive layer support 18 may be a flexible or rigid material.

The PCB page blank 10 thus may be a multi-layered laminate page and may be configured to be sheared, torn, or cut from larger stock sheets, rolls, or strips. Similarly, the PCB page blank 10 may be sheared, torn, or cut into smaller pages or cards to fit into a printer or to suit a specific application. For example, the PCB page blank 10 may be a standard 8.5" by 11" or similar page size. The PCB page blank 10 may be packaged with additional pages as a multi-pack and may be packaged with printer ink, CAD software (described below), instructions, and/or additional circuit components and circuit prototyping tools.

Use of the PCB page blank 10 will now be described in more detail. First, a circuit pattern may be created using CAD software. The circuit pattern may be an entire circuit or only portions of a complete circuit design (i.e., a circuit board layout). The CAD software may include templates or forms for creating the circuit pattern. That is, a page size, page type, page thickness, and other parameters may be selected so that the CAD software may arrange and modify the circuit pattern to be compatible with and to fit onto the PCB page blank 10. The CAD software may also take into account the type of printer and the type of ink being used. Once the circuit pattern is created, the CAD software may generate a negative or positive circuit pattern to be printed in opaque ink onto the flexible substrate 12 of the PCB page blank 10.

The PCB page blank 10 may then be inserted or fed into the printer such that the opaque negative circuit pattern 100 is printed onto the second side 22 of the flexible substrate 12. The opaque negative circuit pattern 100 may alternatively be stamped, laser printed, or manually drawn onto the flexible substrate 12. The flexible substrate 12 may include portions of the opaque negative circuit pattern 100 pre-printed thereon such that only sections of the opaque negative circuit pattern 100 need to be printed. The opaque negative circuit pattern 100 may be partially or completely opaque so as to obscure portions of the flexible substrate 12 and corresponding portions 104 of the curable adhesive 14. Gaps 102 in the opaque negative circuit pattern 100 will leave other portions of the flexible substrate 12 and corresponding portions 106 of the curable adhesive 14 unobscured (delineated from obscured portions 104 by dashed lines in FIG. 1).

The PCB page blank 10 may then be exposed to light such that the light penetrates the portions of the flexible substrate 12 and the portions 106 of the curable adhesive 14 unobscured via the gaps 102 in the opaque negative circuit pattern 100. As mentioned above, the light may be UV light, near-UV light, blue wavelength light, or light of any suitable range in the wavelength spectrum. The unobscured portions 106 of the curable adhesive 14 exposed to the light may then cure so as to bond to corresponding portions 108 of the conductive layer 16.

The flexible substrate 12 and the conductive layer support 18 may then be separated from each other after the curable adhesive 14 has cured such that the bonded portions 108 of the conductive layer 16 are retained by the flexible substrate 12 and the non-bonded portions 110 of the conductive layer 16 are retained by the conductive layer support 18, as shown in FIG. 2. That is, the bonded portions 108 of the conductive layer 16 may be sheared or torn from the non-bonded portions 110 of the conductive layer 16. The separation of the flexible substrate 12 and the conductive layer support 18 may be performed via manual or machine peeling, or via any other suitable separation process.

The flexible substrate 12, curable adhesive 14, and bonded portions 108 of the conductive layer 16, after the bonded portions 108 of the conductive layer 16 are sheared or torn from the non-bonded portions 110, thus form a PCB prototype 200 with the bonded portions 108 of the conductive layer 16 forming circuit traces 202 corresponding to the circuit pattern. Spaces 204 between the circuit traces 202 insulate the circuit traces 202 from each other. Wires and other electronic circuit components may then be soldered or connected to the circuit traces 202 to create a completed circuit. The conductive layer support 18 and the non-bonded portions 110 of the conductive layer 16 (that is, the sacrificial portions of the conductive layer 16 remaining with the conductive layer support 18) may be disposed or recycled.

The PCB prototype 200 may be used as a permanent circuit board if the prototyping process is complete or may be disposed or recycled if the circuit pattern needs refining or if a more permanent circuit board incorporating the desired circuit pattern is required. That is, the PCB prototype 200 may be configured for prototyping only or may be configured for use in long-term or robust applications. The PCB page blank 10 may be used with additional pages and/or other circuit components to create multiple layered flat circuits or circuits which may be applied to three dimensional contoured surfaces. The PCB prototype 200 may be rolled, bent, or flexed, or firm and rigid. The PCB prototype 200 may also be bonded to a surface having a three-dimensional contour via the uncured regions of the curable adhesive 14 or via another adhesive.

It will be understood that the layers of the PCB page blank 10 may be arranged in different orders or utilized in opposite fashion for creating the PCB prototype 200. For example, the conductive layer support 18 may form the base of the PCB prototype 200 while the flexible substrate 12 is removed. In this case, an opaque positive circuit pattern instead of an opaque negative circuit pattern would be deposited on the PCB page blank 10.

The above-described PCB page blank 10 provides several advantages over conventional circuit board prototyping systems. For example, the PCB page blank 10 may be used for rapidly producing a circuit prototype without the need for specialized equipment or harsh etching chemicals. To that end, the PCB page blank 10 may be used with readily-available commercial or industrial-grade printers and computer systems. The PCB page blank 10 may be sized as needed to fit an available printer or to fit a desired application. The PCB page blank 10 may be cut or stamped into any desired two-dimensional shape such as a square, rectangle, circle, or irregular shape. The PCB page blank 10 may also be one of a set of packaged pages so that a number of prototyping iterations may be performed without the need for multiple purchases.

Figure 4:
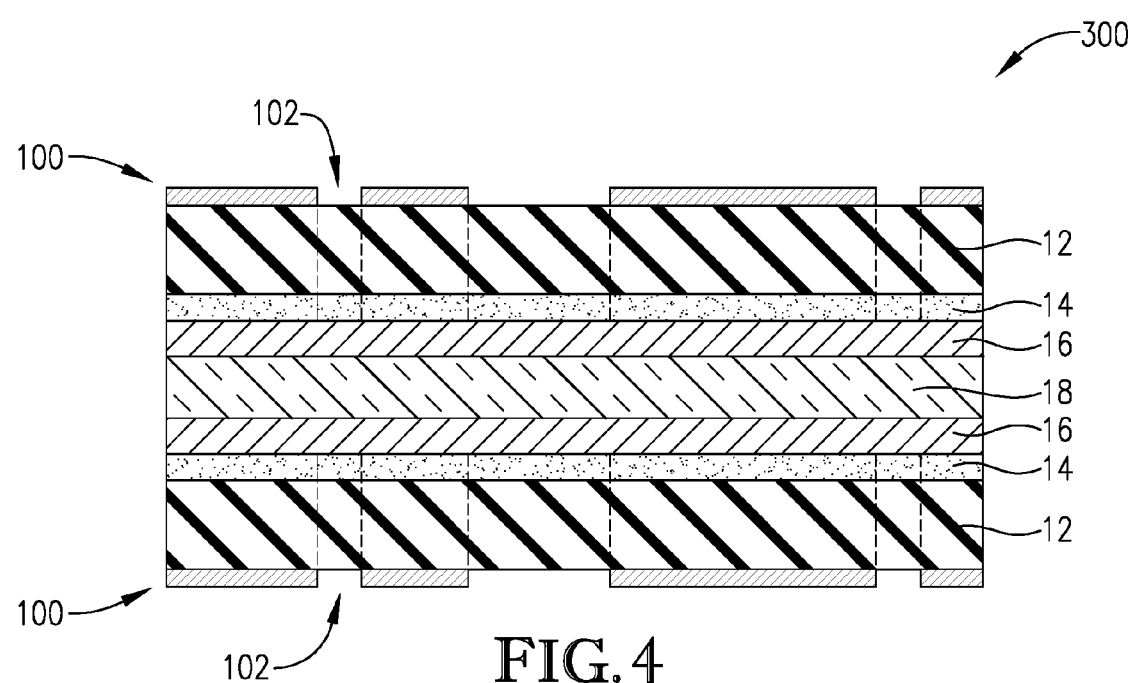
FIG. 4 is a vertical cross section view of a double-sided PCB page blank constructed in accordance with another embodiment of the present invention.

Another embodiment of the present invention is a double-sided PCB page blank 300, similar to the PCB page blank 10, except that the double-sided PCB page blank 300 may have an inverted set of layers on the second side of the conductive layer support 18, as shown in FIG. 4. Opaque circuit patterns may be printed on the surfaces of both flexible substrates such that the resulting double-sided PCB prototype has circuit traces on both sides. The conductive layer support 18 may include pre-formed vias (electrical paths) or interconnects extending between conductive layers 16 for connecting the opposing circuit traces. In this way, more complex circuit prototypes may be created with the double-sided PCB page blank 300

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A PCB blank comprising:
   a substrate having a first side and a second side opposite the first side;
   a curable adhesive adjacent the first side of the substrate, the substrate being configured to receive a circuit pattern on its second side such that the circuit pattern obscures portions of the curable adhesive and does not obscure other portions of the curable adhesive, the unobscured portions of the curable adhesive being configured to cure when exposed to a curing process;
   a conductive layer adjacent the curable adhesive opposite the substrate, portions of the conductive layer being configured to be bonded to the cured portions of the curable adhesive; and
   a conductive layer support adjacent the conductive layer opposite the curable adhesive, the conductive layer support being configured to be separated from the substrate such that the bonded portions of the conductive layer are retained by the substrate and other portions of the conductive layer are retained by the conductive layer support so that the substrate, curable adhesive, and bonded portions of the conductive layer form a circuit with the bonded portions of the conductive layer forming one or more circuit components.

2. The PCB blank of claim 1, wherein the PCB blank is configured to be fed through an ink printer for receiving the circuit pattern therefrom.

3. The PCB blank of claim 1, wherein the substrate is a flexible substrate and the flexible substrate and the conductive layer support are configured to be peeled apart.

4. The PCB blank of claim 1, wherein the circuit components are circuit traces configured to be soldered to electrical components.

5. The PCB blank of claim 2, wherein the first side of the flexible substrate includes pre-printed opaque circuit patterns of common connections or components.

6. The PCB blank of claim 1, wherein the PCB blank is configured to contain pre-formed conductive vias between layers.

7. The PCB blank of claim 1, wherein the circuit is configured to be bonded to a surface having a three-dimensional contour.

8. A method for producing a circuit, the method comprising:
providing a substrate having a curable adhesive adjacent a first side of the substrate;
providing a conductive layer adjacent the curable adhesive opposite the substrate;
providing a conductive layer support adjacent the conductive layer opposite the curable adhesive;
forming a circuit pattern on a second side of the substrate opposite the first side such that the circuit pattern obscures portions of the curable adhesive and other portions of the curable adhesive are unobscured;
exposing the substrate and the circuit pattern to a curing process so that portions of the curable adhesive not obscured by the circuit pattern cure and thereby bond to corresponding portions of the conductive layer and the circuit pattern prevents portions of the curable adhesive obscured by the circuit pattern from curing and thereby do not bond to other portions of the conductive layer; and
separating the substrate and the conductive layer support such that the portions of the conductive layer bonded to the curable adhesive are retained by the curable adhesive and the portions of the conductive layer not bonded to the curable adhesive are retained by the conductive layer support, the substrate, curable adhesive, bonded portions of the conductive layer forming a circuit with bonded portions of the conductive layer forming one or more circuit traces.

9. The method of claim 8, wherein the substrate is a flexible substrate, and wherein the step of forming the circuit pattern includes printing an opaque circuit pattern onto the flexible substrate.

10. The method of claim 9, wherein the step of forming the opaque circuit pattern includes printing the opaque circuit pattern via an ink printer.

11. The method of claim 8, further comprising the steps of designing a circuit pattern and generating the circuit pattern according to the circuit pattern via computer-aided design software.

12. The method of claim 9, wherein the step of separating the flexible substrate and the conductive layer support includes peeling the flexible substrate and the conductive layer apart from each other.

13. The method of claim 9, wherein the flexible substrate, curable adhesive, conductive layer, and conductive layer support cooperatively form a laminate page.

14. The method of claim 9, wherein the opaque circuit pattern is a positive or negative circuit pattern.

15. The method of claim 9, wherein the step of forming the opaque circuit pattern includes manually drawing the opaque circuit pattern onto the flexible substrate.

16. The method of claim 9, further comprising the step of bonding the circuit to a surface having a three-dimensional contour.

17. The method of claim 9, wherein the conductive layer includes pre-cut regions.

18. The method of claim 9, wherein the second side of the flexible substrate includes pre-printed circuit design components.

19. The method of claim 9, wherein the circuit is configured to be laminated so as to provide a protective layer or non-conductive barrier.

20. A PCB blank comprising:
a substrate having a first side and a second side opposite the first side;
a curable adhesive adjacent the first side of the substrate, the substrate being configured to receive a circuit pattern on its second side via a printer such that the circuit pattern obscures portions of the curable adhesive and leaves other portions of the curable adhesive unobscured, the unobscured portions of the curable adhesive being configured to cure when exposed to light traversing through the circuit pattern;
a conductive layer adjacent the curable adhesive opposite the substrate, portions of the conductive layer being configured to be bonded to the cured portions of the curable adhesive; and
a conductive layer support adjacent the conductive layer opposite the curable adhesive, the conductive layer support being configured to be separated from the substrate such that the bonded portions of the conductive layer are retained by the substrate and other portions of the conductive layer are retained by the conductive layer support so that the substrate, curable adhesive, and bonded portions of the conductive layer form a circuit with the bonded portions of the conductive layer forming one or more circuit traces, the circuit traces being configured to be soldered to circuit components.

* * * * *

UNITED STATES PATENT AND TRADEMARK OFFICE
CERTIFICATE OF CORRECTION

PATENT NO. : 9,795,035 B2
APPLICATION NO. : 15/356852
DATED : October 17, 2017
INVENTOR(S) : Jonathan Douglas Hatch and Stephen McGarry Hatch It is certified that error appears in the above-identified patent and that said Letters Patent is hereby corrected as shown below:

In the Specification

Column 1, Line 11, add:
-- STATEMENT REGARDING FEDERALLY-SPONSORED RESEARCH OR DEVELOPMENT
This invention was made with government support under Contract No.: DE-NA0000622 awarded by the Department of Energy. The government has certain rights in the invention. --

Signed and Sealed this
Twenty-first Day of April, 2020

Andrei Iancu
*Director of the United States Patent and Trademark Office*